United States Patent [19]
Hughes et al.

[11] Patent Number: 5,883,784
[45] Date of Patent: Mar. 16, 1999

[54] MOUNTING STRUCTURE FOR HEAT CONDUCTIVELY SUPPORTING A PLANAR ELECTRIC DEVICE

[75] Inventors: Richard P. Hughes, Kanata; Trevor G. Zapach, Ottawa; Patrick T. Lawless, Kanata, all of Canada

[73] Assignee: Northern Telecom Limited, Montreal, Canada

[21] Appl. No.: 832,634

[22] Filed: Apr. 4, 1997

[51] Int. Cl.[6] .................................................. H05K 7/20
[52] U.S. Cl. ..................... 361/707; 174/163; 211/41.17; 257/718; 361/756; 361/802
[58] Field of Search ................. 165/80.2, 80.3, 165/185; 174/16.3; 211/41.17; 254/104; 257/718; 267/150, 158, 160; 361/688, 690, 704, 707, 709–711, 719, 720, 715–716, 752, 754, 756, 759, 798, 801–802; 403/374, 409.1

[56] References Cited

U.S. PATENT DOCUMENTS

| 3,845,359 | 10/1974 | Fedele ...................................... 361/752 |
| 4,829,402 | 5/1989 | Gewebler et al. ........................ 361/707 |
| 5,200,882 | 4/1993 | Blomquist ................................ 361/720 |

*Primary Examiner*—Gregory Thompson
*Attorney, Agent, or Firm*—R. J. Austin; Angela C. de Wilton

[57] ABSTRACT

Mounting for holding a planar electronic device, e.g. a printed circuit board in electronic slots to receive edges of the electronic device and a clamp is inserted into each slot to clamp an edge of the device in heat conductive engagement with a side surface of the slot. The clamp has a rigid elongate clamp element inserted along the slot, springs to urge the clamp element towards the side surface of the clamp to provide a clamping action and a lever to move the clamp element out of a clamping position to release the electronic device.

6 Claims, 3 Drawing Sheets

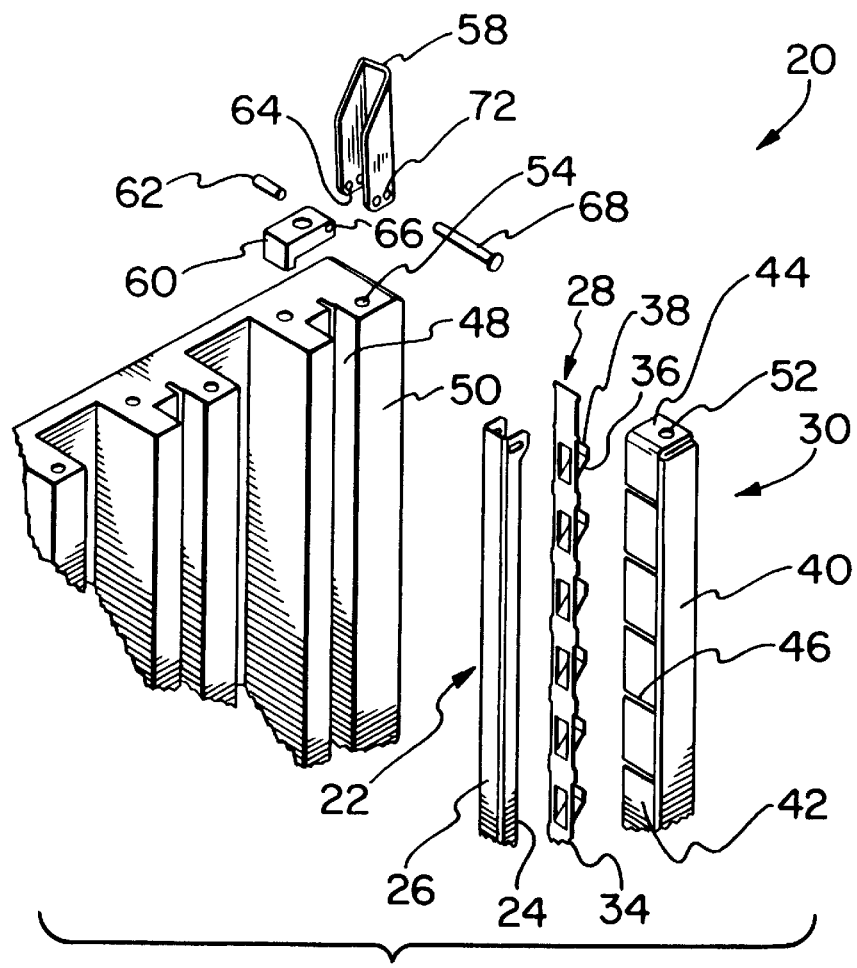
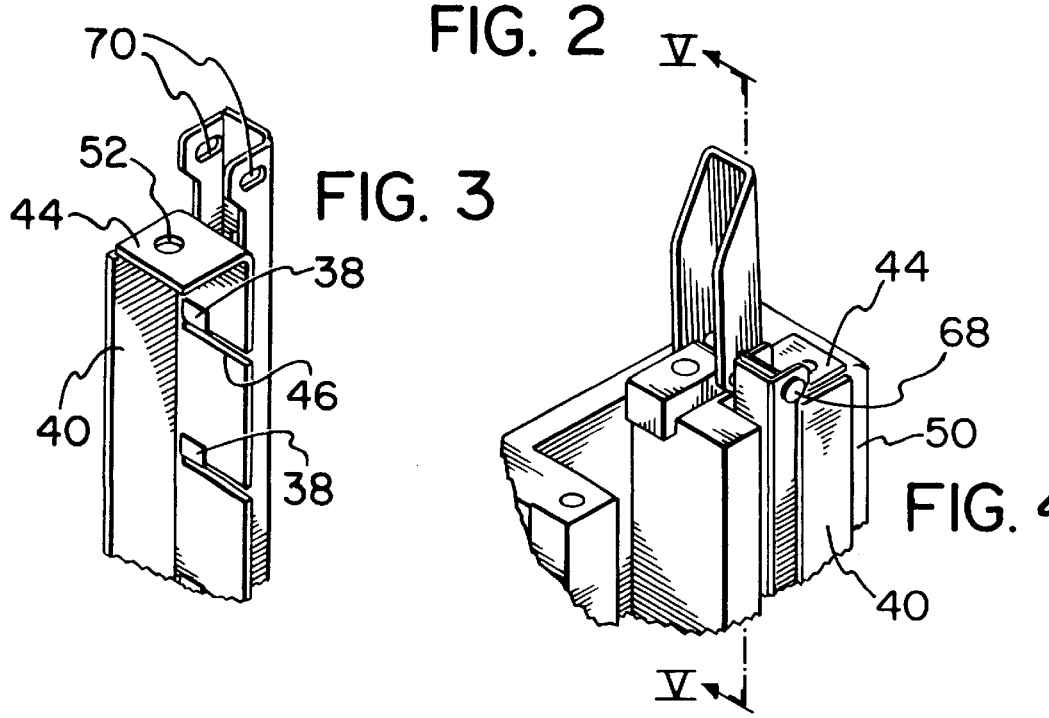

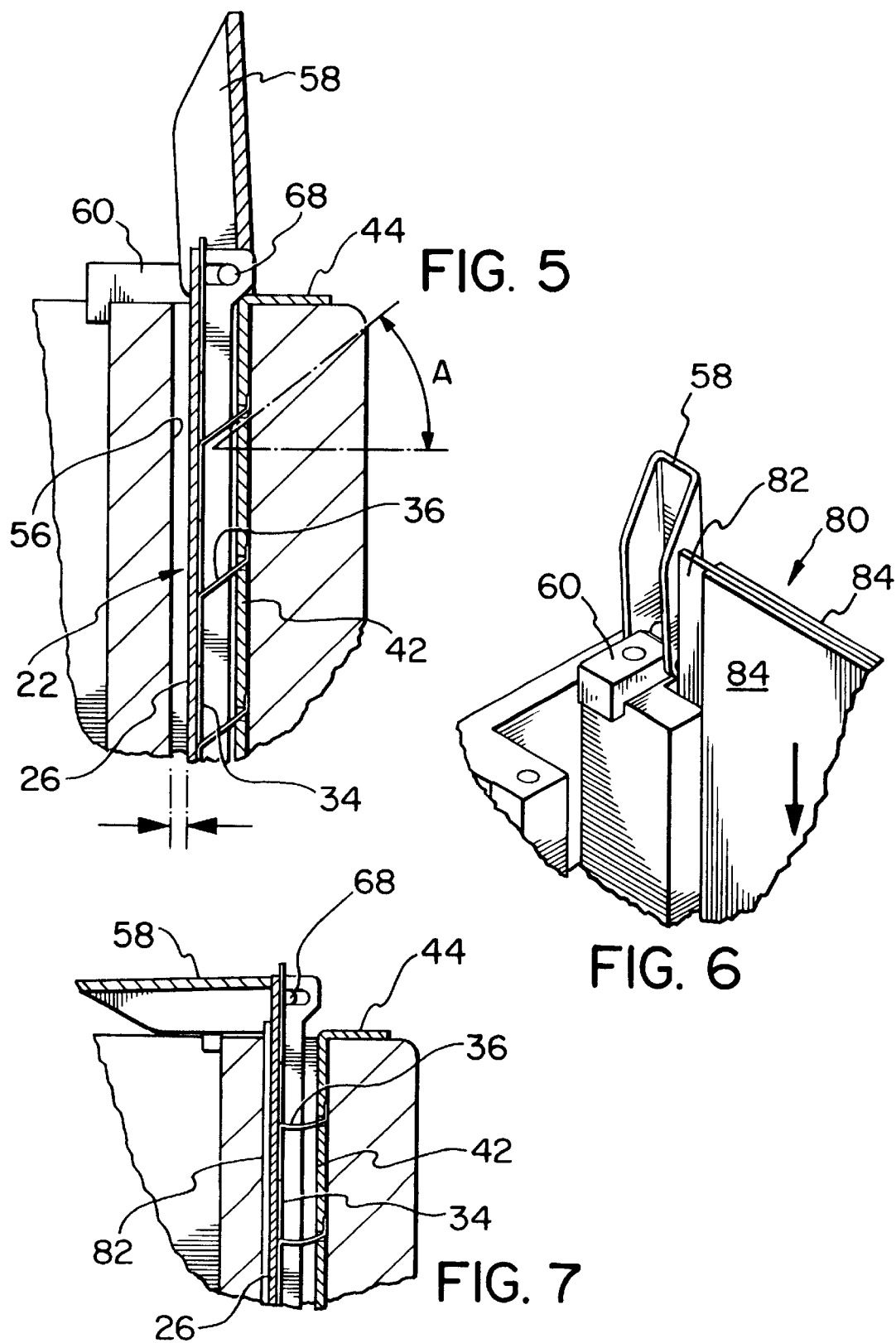

MOUNTING STRUCTURE FOR HEAT CONDUCTIVELY SUPPORTING A PLANAR ELECTRIC DEVICE

FIELD OF THE INVENTION

This invention relates to a mounting structure for heat conductively supporting a planar electronic device.

BACKGROUND OF THE INVENTION

In the electronics industry, it is conventional to house planar electronic devices in receiving stations in shelves of electronic equipment. Such devices include printed circuit boards carrying electronic components or circuit packs incorporating one or more of such printed circuit boards.

When removal of heat from a planar electronic device is not an important issue or is efficiently dealt with in other ways, a mounting structure is not required to be heat conductively connected to edge regions of the device and the edge regions are simply mounted in guide slots in their receiving stations. However, when it is necessary to remove heat from these edge regions, a mounting structure acts as a heat sink and pressure applying structures are placed in each guide slot at one side of an edge region of an electronic device mounted in the mounting structure. These pressure applying devices apply pressure to the one side of the edge regions so as to force the other side of the edge regions against the surface at one side of each of the guide slots whereby heat conductive engagement is acquired for conduction of heat from the devices directly into the mounting structures.

Conventionally, pressure applying structures are each formed of a large number of parts which include a plurality of sleeves arranged end-to-end in a guide slot. A threaded pin extends through the sleeve arrangement. The sleeves have inclined ends which are opposed from sleeve-to-sleeve and upon tightening of the threaded pin, axial pressure is applied to the sleeve arrangement which causes, by mutual contact between the inclined ends, relative lateral movement between adjacent sleeves. As a result the sleeve arrangement expands in a radial direction so as to apply pressure against the one side of an edge region as discussed above. However, this pressure is only applied by the contact of alternate sleeves against an edge region of an electronic device with the result that while intense pressure is applied through the edge region in alignment which each of the alternate sleeves, direct pressure is not applied to the lengths of the edge region between these alternate sleeves. As a consequence, slight undulation in an edge region may result whereby continuous heat conductive pressure is not applied for the full length of the edge region thereby limiting the heat conductive efficiency between edge region and mounting structure. Thus, conventional pressure applying structures are severely limited in their capability to effect high efficiency heat transfer from a planar electronic device through edge regions of the device into a mounting structure. In addition to this, there is a further disadvantage in that such pressure applying structures in employing a large number of parts which are precisely made, are extremely expensive to manufacture and assemble and of course are not of simple design.

Another known method of creating heat conductive contact between an edge region and an electronic device, an elongated cam is rotated within a slot for the purpose of providing lateral pressure to an edge region of an electronic device to create the heat conductive contact required. However, this solution is also expensive to produce and requires high precision machine parts.

SUMMARY OF THE INVENTION

The present invention is to provide a mounting structure which may be economically manufactured and simple in design while also providing for the high efficiency heat transfer from the electronic device into the mounting structure.

Accordingly, the present invention provides a mounting structure for holding a planar electronic device in a receiving station in an electronic apparatus, the mounting structure comprising two heat conductive holding elements spaced apart to define the receiving station between them, each of the holding elements defining a guide slot for receiving an edge region of the device and for guiding the device into the receiving station, and a clamp for insertion into the guide slot to clamp the edge of the device heat conductively against a first side surface of the slot, the clamp comprising: a) a rigid elongate clamp element locatable along the slot; b) spring means comprising a plurality of springs which are spaced-apart along and operate between the second side surface of the slot and the elongate clamp element to urge the elongate clamp element laterally along its length towards the first side surface of the slot; and c) lever means operably connected to the clamp element and movable between a first position in which it holds the clamp element spaced away from the first side surface of the guide slot and against the spring urgency and a second position in which the clamp element is released by the lever means to permit the clamp element to be moved towards the first side surface of the guide slot under the spring urgency and into a position in which the clamp element clamps the edge region of the planar electronic device heat conductively against the first side surface.

With the mounting structure according to the invention all of the features may be simply made from sheet metal which is a simple and cheap method of manufacture.

The elongate clamp element located along the slot is positioned to lie alongside the edge region of the electronic device. With the lever means in its first position the elongate clamp element is restrained from applying lateral pressure to the edge region thereby allowing the device to be inserted or withdrawn from its receiving station. However, the lever means when operated from the first to the second position enables the elongate clamp element to move laterally with a clamping pressure against the edge region of the device with a continuous pressure from end-to-end of the edge region. Thereby a constant heat conductive pressurized contact is achieved between the edge region and the first side surface of the slot. Hence, efficient heat conductive contact is created between the edge region and the first side surface of the slot for the full length of the edge region. To create such pressure against the edge region, the elongate clamping element is required to be rigid so that any undulation in the pressurized edge region is extremely unlikely to occur. For this particular purpose and when formed from sheet metal, the elongate clamp element is preferably formed as a rigid channel having a base and side walls with the base facing towards the first side surface of the slot. With this arrangement, sidewalls of the channel provide the necessary rigidity against deflection of the base when a clamping operation takes place.

It is also preferable for the spring means to comprise a plurality of cantilever springs which are spaced apart along the elongate clamp element to provide the required pressure from end-to-end of the edge region. In order for the clamp to work efficiently, it should at all times be positioned with a clamping surface lying parallel to the first side surface of the slot. To assist in providing this advantage, each of the cantilever springs has one end formed integrally with an elongate pressure applying member which is disposed on the side of the elongate clamp element other than the clamping surface. To assist in ensuring the parallel relationship between the clamping surface and the first side surface of the slot, then the other ends of the springs need to be held in fixed positions also. For this purpose in a convenient arrangement an elongate spring end location member is provided and which is formed with spaced-apart laterally extending location slots. These slots receive end regions of the cantilever springs to locate these end regions in position along the guide slot determined by the positions of the location slots. Thus, the elongate clamp element is capable of moving towards and away from the first side surface of the slot with slight longitudinal movement of the clamp element dictated by a pivoting action of the cantilever springs about their ends disposed in the location slots. This movement is effectively a parallelogram linkage in which the elongate clamp element moves in parallel planes.

BRIEF DESCRIPTION OF THE DRAWINGS

One embodiment of the invention will now be described, by way of example, with reference to the accompanying drawings, in which:

FIG. 2 is a view similar to FIG. 1 of part of a holding element of the holding structure and showing a clamp in exploded form;

FIG. 3 is an isometric view from the opposite side of the clamp and shown in partially assembled form;

FIG. 4 is a view similar to FIG. 1 but to larger scale showing the detail at one end of a clamp mounted within a guide slot of the mounting structure;

FIG. 5 is a cross-sectional view taken along line V—V in FIG. 4 to show the guide clamp is a first position;

FIG. 6 is a view similar to FIG. 4 and showing a printed circuit board being inserted into a receiving station; and FIG. 7 is a view similar to FIG. 5 showing the clamp in a second and clamping position to hold the printed circuit board in position in the receiving station.

DETAILED DESCRIPTION OF THE PREFERRED EMBODIMENTS

Figure 1:
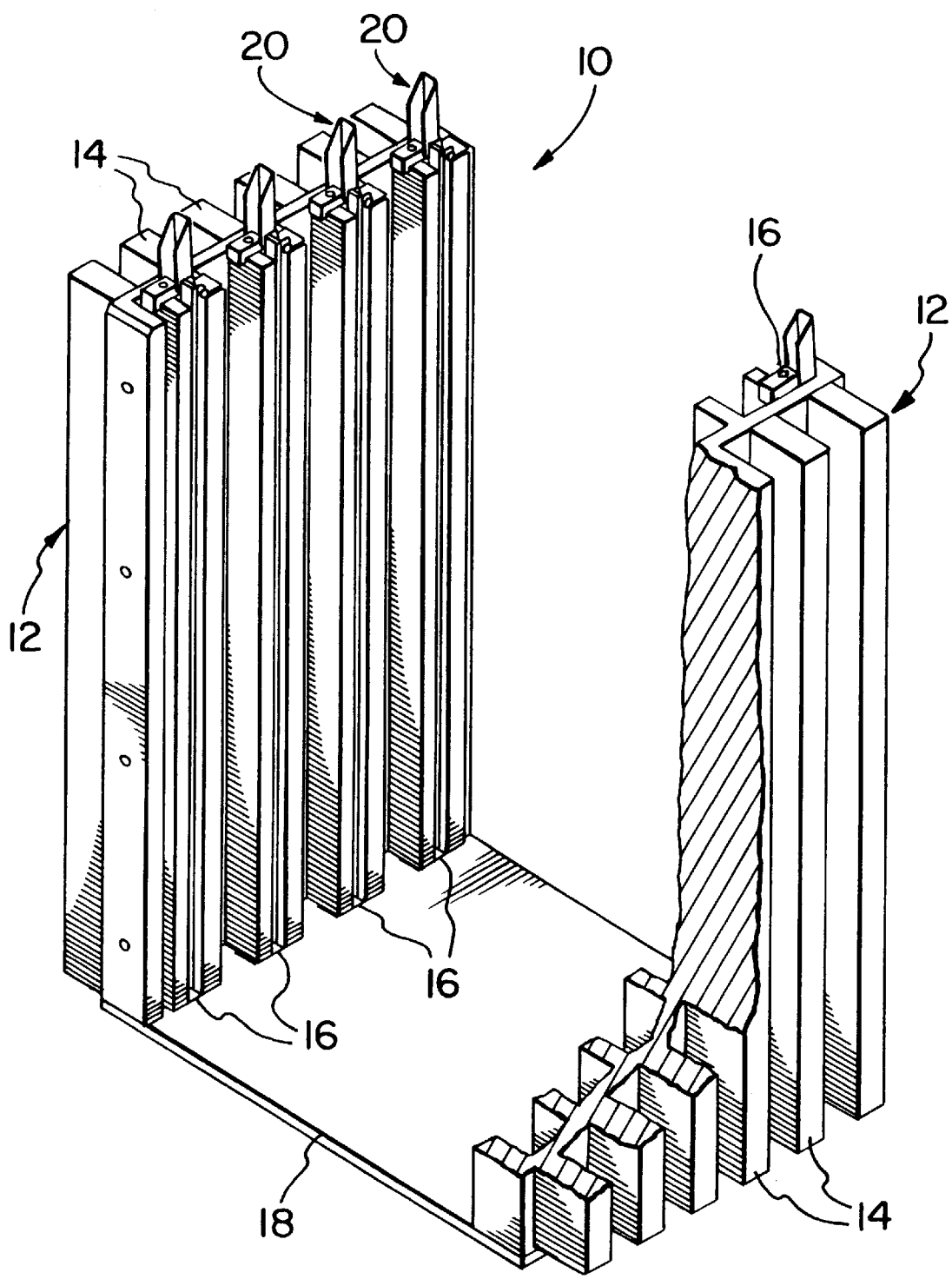
FIG. 1 is an isometric view of a mounting structure for holding printed circuit boards in receiving stations.

In the embodiment, a mounting structure 10 for holding printed circuit boards in receiving stations comprises two heat conductive holding elements 12. Each holding element comprises a heat sink structure having on one side heat removable fins 14 and, on the other side, parallel guide slots 16 having first and second side surfaces 48 and 56 respectively. Each guide slot is aligned with a corresponding guide slot 16 in the other holding element 12. The arrangement is such that the guide slots 16 extend vertically for vertical downward reception of printed circuit boards into the slots. At the lower end of the structure is disposed a back plane 18 for electrical connection in conventional fashion with printed circuit boards when these are in their respective receiving stations.

It is intended that the two holding elements should conduct heat away from the structure which has been generated by electronic components mounted upon the respective circuit boards when these are received in their receiving stations. For assisting in heat transfer, it is necessary for an edge region of each printed circuit board to be clamped firmly against a side of its receiving slot 16 so that heat may be transferred from the board to the holding element efficiently and mainly by heat conduction. For this particular purpose, in each of the slots 16 a clamp 20 is provided. A clamp is shown in each of the slots in FIG. 1 and is shown in more detail in each of FIGS. 2, 3, 4, 5 and 7.

As shown particularly by FIGS. 2 and 3, each clamp comprises an elongate clamp element 22 which is locatable along a respective slot 16. Each elongate clamp element 22 is formed from sheet metal which is stamped and pressed into a channel having two side walls 24 and a base 26. It is intended that the elongate clamp element should be rigid and for this purpose the side walls of the channel increase the rigidity. The clamp also includes a spring means 28, an elongate spring end location member 30, and a lever means 32 for operating the clamp element 22.

The spring means 28 comprises an elongate pressure applying member 34 which is disposed between the side walls 24 of the clamp member 22 so as to lie against the base 26 as shown particularly by FIG. 5. The pressure applying member 34 extends for the full length of the clamp element 22. The spring means also includes a plurality of cantilever springs 36 which are pressed from the elongate pressure applying member 34 so that each spring is integral with the pressure applying member. As may be seen from the figures, the pressure applying member is also formed from stamped and pressed metal sheet. The cantilever springs 36 are all inclined at the same angle relative to the plane of the pressure applying member 34. The free ends 38 of the springs 36 are held in respective positions along the guide slot 16 by the spring end location member 30. The spring end location member 30 is also formed from stamped and pressed sheet metal and has a first elongate side wall 40, a second elongate side wall 42 and two turned-over end flanges 44 (one only being shown in the figures). The elongate side wall 42 is provided with a plurality of spaced-apart laterally extending location slots 46 into each of which is received the free end 38 of an associated spring 36 with the end being turned upwards on the other side of the wall 42 as shown by FIG. 3.

The assembled clamp element 22, the spring means 28 and the spring end location member 30 are located in position in their respective slot as shown in FIGS. 1, 2, 5 and 7. When in position within the slot, the spring end location member is disposed with the wall 42 extending into the slot against the first side surface 48 of the slot and with the junction between wall 42 and the wall 40 lying at the entrance to the slot with the wall 40 disposed against an outer surface 50 of the holding element. In the assembled position, the end flanges 44 have location holes 52 which are aligned with location holes 54 in ends of the holding element 12 and securing screws (not shown) pass through the aligned holes 52 and 54 to hold the assembly in position.

With the assembly in position as described, the springs 36 operate against the clamp element 22 so as to move the clamp element towards the second side surface 56 of the slot (see FIG. 5) unless prevented from doing so. To prevent this occurrence and to control movement of the elongate clamp element, the lever means 32 is provided. The lever means comprises a channel-shaped short operating lever 58. The lever straddles a mounting block 60 secured to the end of the holding element 12 and a pin 62 passing through aligned holes 64 and 66 in the lever and in the block pivotally mount the lever is a fixed axial position relative to the holding element. A further pin 68 passes through aligned slots 70 in upper ends of the side walls 24 of the clamp element 22, these upper ends extending above the holding element 12 as shown particularly by FIG. 4. The pin 68 also passes through aligned holes 72 in the lever 58 so that the pins 62 and 68 lie axially parallel and spaced apart. Hence, the lever 58 is pivotally connected to the upper end region of the clamp element at a position eccentric to the fixed axial position dictated by the pin 62.

In use of the clamp, before a printed circuit board is inserted into the receiving station for that clamp, the features of the clamp are in the position shown in FIGS. 1, 4, 5 and 6. In this position, the lever 58 is substantially vertical with the pin 68 rotated to a clockwise position substantially horizontally alongside the pin 62. The pin 68 in this position is urged against the right-hand end of the slot 70 as viewed in FIG. 5 thereby forcing the clamp element 22 towards the right and toward the second side surface 56 of the slot 16 as shown in FIG. 5. This moves the clamp element slightly downwardly in that figure while also moving it away from the second side surface 56 of the guide slot 16. This causes a pivoting downwards of the springs 36 to an inclined position as shown by FIG. 5 with each spring inclined at an angle "A" to the horizontal. In this position the space between the clamp element 22 and the side surface 56 of the slot is sufficient to accommodate an edge of a printed circuit board 80 as shown by FIG. 6. The printed circuit board 80 has a heat dispersing planar member 82 made from copper which is sandwiched between board layers 84. At each end of the printed circuit board, the layer 82 projects outwardly to be accommodated within the respective slots 16. This is shown in FIG. 6 in which the board is being received within its respective receiving station and also in FIG. 7 with the board in position. The lever 58 is then pivoted in an anticlockwise direction as shown from FIG. 5 to FIG. 7. This has the effect of pivoting the pin 68 in an anticlockwise direction around the pin 62 to its final position shown in FIG. 6 which lies slightly to the left-hand side of a vertical centerline passing through the pivotal axis of pin 62. This lever action causes the clamp element to be raised and also to allow it to be moved towards the left in FIG. 6 by the resiliency of the springs 36 which attempt to move the clamp element 22 against the slot surface 50. This movement of course brings the outer or clamp surface of the clamp element 22 against the side surface of the projecting part of the layer 82 and the force of the springs 36 then proceeds to clamp this edge region against the side surface 50 of the slot. As may be seen from FIG. 7, the pressure exerted by the springs at this position tends to deform the springs slightly into curved configuration.

As may be seen from the above description, the clamp is formed substantially entirely from sheet metal which has been stamped and pressed thereby enabling an extremely economic structure to be formed. In addition, the action of the clamp is simple and incorporates a minimum number of parts, namely the clamp 22, the spring means 28 and the spring end location member 30 in addition to the lever 58 and throughpins 62 and 68 with the block 60. The structure operates most efficiently to ensure maximum heat transfer by heat conductivity into the mounting elements 12. The reason for this is that the clamp element 22 is substantially rigid and engages the edge region of the layer 82 of the board 80 completely along the length of the layer thereby applying pressure along the length. This unbroken pressure along the length ensures that the edge region of the layer 82 is pressed completely along its length against the side surface of the slot without any reduction in pressure at any position. Hence, deformation of the edge region of the layer 82 between pressure points is virtually eliminated and a constant positive pressure is applied to hold the layer 82 against the side surface of the slot during operation. Thus the heat contact area between the layer 82 and the mounting element 12 is maximized thereby promoting maximum heat exchange efficiency from the printed circuit board into the mounting element.

What is claimed is:

1. A mounting structure for holding a planar electronic device in a reception station in an electronic apparatus comprising two heat conductive holding elements spaced-apart to define the receiving station between them, each of the holding elements defining a guide slot for receiving an edge region of the device and for guiding the device into the receiving station, the guide slot having first and second side surfaces, and a clamp for insertion into the guide slot to clamp the edge of the device heat conductively against the first side surface of the slot, the clamp comprising:

a) a rigid elongate clamp element locatable along the slot;
   b) a plurality of cantilever springs which are spaced-apart along the second side surface, and operable between the second side surface of the slot and the elongate clamp element to urge the elongate clamp element laterally along its length towards the first side surface of the slot; and
   c) lever means operably connected to the clamp element and movable between a first position in which it holds the clamp element spaced away from the first side surface of the guide slot and against the spring urgency and a second position in which the clamp element is released by the lever means to permit the clamp element to be moved towards the first side surface of the guide slot under the spring urgency and into a position in which the clamp element clamps the edge region of the planar electronic device against the first side surface.

2. A mounting structure according to claim 1 wherein the spring means comprises an elongate pressure applying member extending parallel to and disposed on one side of the elongate clamp element, the plurality of cantilever springs each having one end integral with the pressure applying member to cause the pressure applying member to apply pressure along the length of the elongate clamp element to urge the elongate clamp element towards the first side surface of the slot.

3. A mounting structure according to claim 2 wherein the elongate clamp element is formed from sheet metal as a rigid channel having a base and side walls with the base facing towards one of the first or the second side surface of the slot, and the pressure applying member is disposed within the channel and applies pressure against the channel base.

4. A mounting structure according to claim 2 wherein an elongate spring end location member is provided for the spring means, the location member formed with spaced-apart laterally extending location slots which receive end regions of the cantilever springs to locate these end regions in positions along the guide slot determined by the positions of the location slots.

5. A mounting structure according to claim 4 wherein the lever means comprises a lever pivotally mounted in a fixed axial position relative to an associated holding element at one end of the guide slot, the lever also being pivotally connected to an adjacent end region of the elongate clamp element about an axis eccentric the fixed axial position, the lever upon movement between the first and second positions effecting movement of the clamp element towards the first side surface of the guide slot accompanied by a component of movement of the clamp element in its longitudinal direction and change in angular orientation of the cantilever springs as they influence movement of the clamp element towards the first side surface.

6. A mounting structure according to claim 4 wherein the location member is secured at its ends to end surfaces of an associated holding element.

* * * * *